United States Patent [19]

Chai et al.

[11] Patent Number: 5,656,955
[45] Date of Patent: Aug. 12, 1997

[54] LOW POWER OUTPUT BUFFER CIRCUIT

[75] Inventors: Sang-Hoon Chai, Daejeon; Won-Chul Song, Daejeon; Hoon-Bock Lee, Daejeon; Chang-Sik Yu, Daejeon; Won-Chan Kim, Seoul, all of Rep. of Korea

[73] Assignees: Electronics and Telecommunications Research Institute, Daejeon; Korea Telecommunication Authority, Seoul, both of Rep. of Korea

[21] Appl. No.: 555,854

[22] Filed: Nov. 13, 1995

[30] Foreign Application Priority Data

Dec. 13, 1994 [KR] Rep. of Korea .............. 94-33909

[51] Int. Cl.$^6$ .............................................. H03K 19/00
[52] U.S. Cl. ................... 326/115; 326/17; 326/68; 326/83
[58] Field of Search ....................... 326/115, 112, 326/119, 121, 83, 17, 68, 73, 31, 34, 86

[56] References Cited

U.S. PATENT DOCUMENTS

| | | | |
|---|---|---|---|
| 4,978,870 | 12/1990 | Chen et al. | 326/68 |
| 5,216,295 | 6/1993 | Hoang | 326/115 |
| 5,486,777 | 1/1996 | Nguyen | 326/83 |

OTHER PUBLICATIONS

Flynn, et al: "A 1.2-um CMOS Current-Controlled Oscillator"; pp. 982-987, Jul. 1992; IEEE Journal of Solid-State Circuits, vol. 27, No. 7.

Chao, et al.: "A 140 Mbit/s CMOS LSI Framer Chip for a Broad-Band ISDN Local Access System"; Feb. 1988, pp. 133-141; IEEE Journal of Solid-State Circuit, vol. 23, No. 1.

Young, et al: "A PLL Clock Generator with 5 to 110 MHz of Lock Range of Microprocessors"; Nov. 1992, pp. 1599-1606; IEEE Journal of Solid-State Circuits, vol. 27, No. 11.

*Primary Examiner*—Edward Westin
*Assistant Examiner*—Jan Santamauro
*Attorney, Agent, or Firm*—Larson & Taylor

[57] ABSTRACT

A low power output buffer circuit for outputting an Emitter Coupled Logic(ECL) signal or Pseudo ECL(PECL) signal using a CMOS device is disclosed. The prior art differential output buffer circuit is comprised of two independent output buffer circuits and each output buffer circuit utilizes 50 ohms of the load resistors, having 20 mW of current to be applied to the circuit, which requires 100 mW of total consumptive power to operate the entire circuit. According to the present invention, a simplified output buffer circuit can be constructed by connecting 100 ohms of load resistors having a center tap to ground to two pads, which reduces half of the consumptive power as compared to that in the prior art circuit.

1 Claim, 1 Drawing Sheet

5,656,955

LOW POWER OUTPUT BUFFER CIRCUIT

FIELD OF THE INVENTION

The present invention relates to a low power output buffer circuit, and more particularly, to a differential output buffer for Emitter Coupled Logic(hereinafter, referred to as "ECL") or Pseudo ECL(hereinafter, referred to as "PECL") having a low power consumptive characteristics.

BACKGROUND OF THE INVENTION

Generally, in high speed circuit implemented by a high frequency, a differential circuit is mainly used to improve the noise characteristics thereof. Among them, especially in the circuit implemented by a high frequency more than several ten MHz, since a signal voltage level is below 1 V, circuits which are enabled by a differential ECL signal(high level: 0 V, low level: −1 V) or differential PECL signal(high level: +4 V, low level: +3 V) having a high speed operational characteristic are widely used. An integrated circuit for ECL or PECL signal process utilizing the high speed circuits as mentioned above is mainly for use with other circuits or other systems and is connected with impedance matching of 50 Ohms at input/output stages. Thus, a buffer circuit provided at the output stage of the integrated circuit which is implemented by the high frequency should have a capability of operating a load having 50 Ohms of load resistance.

FIG. 1 illustrates a circuit showing a conventional CMOS differential output buffer and load resistors each connected thereto.

In the figure, the circuit comprises two input stages 1 and 2 to which signals having a complementary relation with the ECL signal or THE PECL signal are applied, respectively. Reference numerals 3 and 4 denote first and second PMOS transistors, reference numerals 5 and 6 denote first and second pads to output output signals, and reference numerals 7 and 8 denote first and second load resistors each having 50 ohms, assuming when the circuit is in use.

A constant current source CS1 is connected to the voltage source Vdd (+5 V) and is also connected to the respective drains of the first and the second PMOS transistors 3 and 4. The respective gates of the first and the second PMOS transistors 3 and 4 are connected to the first and input stages 1 and 2, and the respective sources thereof are connected to the first and the second pads 5 and 6, respectively. The first and the second resistors 7 and 8 are then connected between a voltage source Vtt (+3 V) and the first and the second pads 5 and 6, respectively.

The operational principle of the circuit as constituted above will now be described in detail.

Referring again to FIG. 1, when a high level voltage (+4 V) is applied to the first input stage 1, and a low level voltage (+3 V) is applied to the second input stage 2,, respectively, the second PMOS transistor 4 turns on, allowing 20 mA of current to flow from the second pad 6 to the second load resistor 8. Thus, 1 V of potential difference between the first and the second load resistors 7 and 8 occurs, so that the first output pad 5 will be maintained at a low level voltage (+3 V), whereas the second output pad 6 will be maintained at a high level voltage (+4 V), respectively.

On the contrary, if a low level voltage (+3 V) is applied to the first input stage 1, and a high level voltage (+4 V) is applied to the second input stage 2, respectively, the first PMOS transistor 3 turns on, thereby permitting 20 mA of current to flow from the first pad 6 to the first load resistor 7. As a result, the first output pad 5 may be maintained at a high level voltage (+4 V), whereas the second output pad 6 may then be maintained at a low level voltage (+3 V), respectively. Likewise, 1 V of potential difference between the first and the second load resistors 7 and 8 occurs. Considering an operational point of view of the entire output buffer, in order to obtain 1 V of potential difference at the first and the second output pads 5 and 6, it is necessary for the output buffer to have a capability of providing 20 mA in total. As a result, the total power consumption required for the entire circuit including the PMOS transistors and load resistors will be about 100 mW.

Therefore, it is an object of the present invention to overcome the above disadvantages in the prior art and provide a differential output buffer for Emitter Coupled Logic(ECL) signal or Pseudo ECL(PECL) signal having a low power consumption and, superior high frequency characteristics.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A differential output buffer for the ECL or PECL of the present invention is defined by the claims with a specific embodiment shown in the attached drawings. For the purpose of summarizing the invention, the invention includes a first power source Vdd for supplying a first predetermined voltage to the entire circuit. A second power source Vee then supplies a second predetermined voltage which is relatively lower than the first voltage, wherein a predetermined potential difference exists between the first and second predetermined voltages. A first input stage inputs a first ECL signal and a second input stage inputs a second ECL signal which is a complementary signal of the first ECL signal, respectively. A first PMOS transistor has a source electrode, a drain electrode and gate electrode, where the source electrode thereof is connected to the second voltage source and the gate electrode thereof is connected to the second input stage. A second PMOS transistor also has a source electrode, a drain electrode and gate electrode, where the source electrode thereof is connected to the second voltage source and the gate electrode thereof is connected to the first input stage. A constant current source is connected to the ground. A first NMOS transistor has a source electrode, a drain electrode and gate electrode, where the source electrode thereof is connected to the ground, the gate electrode thereof is connected to the second input stage and the drain electrode thereof is connected to the drain electrode of the first PMOS transistor. A second NMOS transistor has a source electrode, a drain electrode and gate electrode, where the source electrode thereof is connected to the constant current source, the gate electrode thereof is connected to the first input stage and the drain electrode thereof is connected to the drain electrode of the second PMOS transistor. A first output pad has two terminals, one terminal thereof connected to the drain of the second PMOS transistor. A second output pad also has two terminals, one terminal thereof connected to the drain of the first NMOS transistor. A first load resistor has two terminals, having one terminal thereof connected to the other terminal of the first output pad. A second load resistor has two terminals, having one terminal thereof connected to the other terminal of the second output pad and the other terminal of the second load resistor connected to the other terminal of the first load resistor.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be made to the following detailed description taken in conjunction with the accompanying drawings in which.

Similar reference characters refer to similar parts throughout the several views of the drawings.

DETAILED DESCRIPTION OF THE INVENTION

Figure 1:
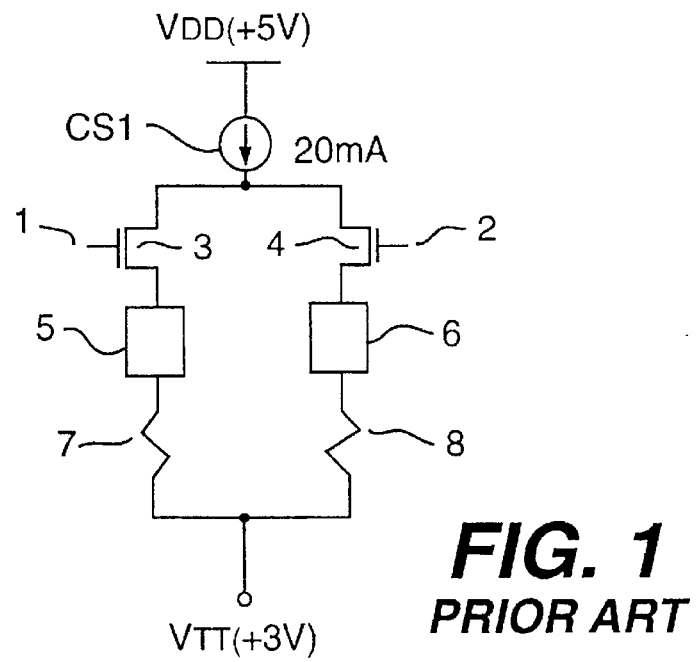
FIG. 1 is a schematic circuit diagram showing a conventional CMOS differential output buffer, and FIG. 2 illustrate a circuit showing a CMOS differential output buffer according to the present invention.
Figure 2:
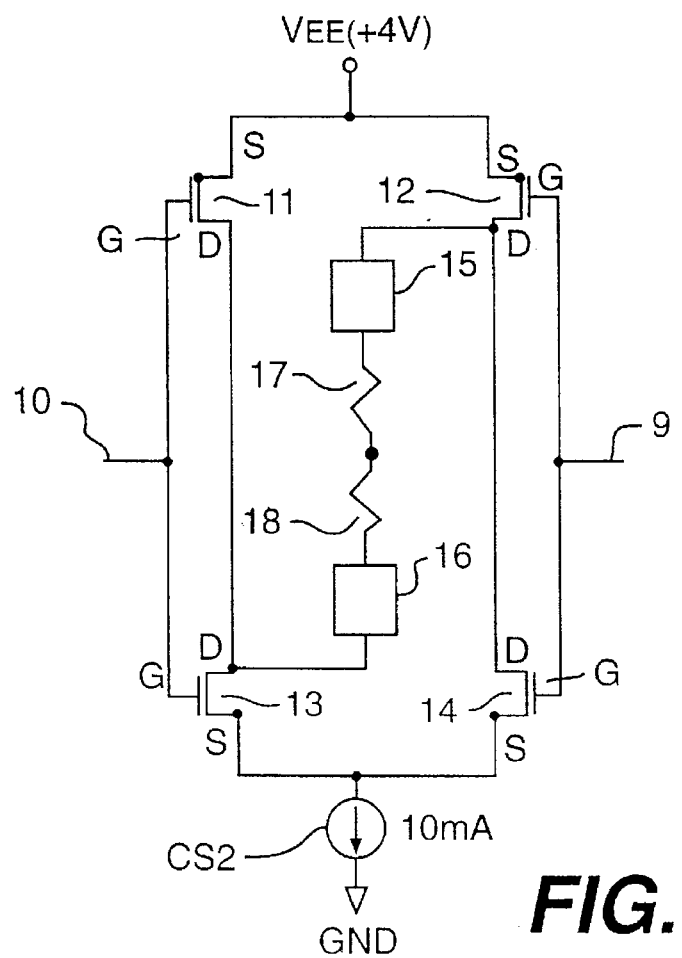

For a more fuller understanding of the nature of the embodiment of the invention, the present reference will now be made to following description taken in conjunction with FIG. 2.

In the drawing, it represents a CMOS differential. Output buffer according to the preferred embodiment of the present invention.

Reference numerals 9 and 10 represent a first and a second input stage to which signals having a complementary relation with the ECL signal or THE PECL signal are applied, respectively. Reference numerals 11 and 12 designate first and second PMOS transistors, reference numerals 13 and 14 designate first and second NMOS transistors, reference numerals 15 and 16 designate first and second pads to output signals, and reference numerals 17 and 18 designate first and second load resistors, each having 50 ohms, when in use.

The respective sources of the first and the second PMOS transistor 11 and 12 are connected to a second voltage source Vee (+4 V), respectively. The drain of the first PMOS transistor 11 is connected to the drain of the first NMOS transistor 13, and the drain of the second PMOS transistor 12 is connected to the drain of the second NMOS transistor 14. The respective gates of the first PMOS transistor 11 and the first NMOS transistor 13 are connected to the second input stage 10, respectively. The respective gates of the second PMOS transistor 12 and the second NMOS transistor 14 are connected to the first input stage 9, respectively. The respective sources of the first and the second NMOS transistor 13 and 14 are connected to the ground (GND). One terminal of the first output pad 15 is connected to the drain of the second PMOS transistor 12, and one terminal of the second output pad 16 is connected to the drain of the first NMOS transistor 13, respectively. The other terminals of the first and the second output pads 15 and 16 are connected to the respective one terminals of the first and the second load resistors 17 and 18 which are connected in series with each other, respectively.

It should be noted that the structure as mentioned above is the same as that in the case in which an ECL signal is inputted.

The operational principle of the output buffer according to the invention as constituted above will now be described by way of the example where the PECL signal is inputted.

Referring again to FIG. 2, when a high level voltage (+4 V) is inputted to the first input stage 9, and a low level voltage (+3 V) is inputted to the second input stage 10, respectively, the first PMOS transistor 11 and the second NMOS transistor 14 turn on, so that a 10 mA of current flows from the first output pad 15, through the first and second load resistors 17 and 18, to the second output pad 16. Thus, 1 V of potential difference between the first and the second load resistors 17 and 18 may occur. As a result, the first output pad 15 will be maintained at a high level voltage (+4 V), whereas the second output pad 16 will be maintained at a low level voltage (+3 V), respectively.

On the other hand, if a low level voltage (+3 V) is inputted to the first input stage 9, and a high level voltage (+4 V) is inputted to the second input stage 10, respectively, the second PMOS transistor 12 and the first NMOS transistor 13 turn on, thereby flowing 10 mA of current from the second output pad 16, through the first and second load resistors 17 and 18, to the first output pad 15. As a result, the first output pad 15 will be maintained at a low level voltage (+3 V), whereas the second output pad 16 will be maintained at a high level voltage (+4 V), respectively. Consequently, 1 V of potential difference between the first and the second load resistors 17 and 18 can be obtained. At the time, since the first voltage source Vdd supplied to the entire circuit is +5 V, the total consumptive power required for the entire circuit including the PMOS and NMOS transistors and load resistors will be about 50 mW, which may reduce half of the consumptive power as compared to that in the prior art circuit.

It should also be noted that the structure and the operation of the preferred embodiment of the invention as mentioned above is the same as that in the case that an ECL signal is inputted.

As described above, according to the output buffer of the present invention described with reference to the preferred embodiment, although 100 ohms of the resistors (50 ohms+ 50 ohms) as a load resistor have been used, since the point between the first load resistor 17 and the second load resistor 18 is connected to the AC ground, the AC resistance of the first and the second output pads 15 and 16 become 50 ohms, so that the impedance matching at 50 ohms of resistance is possible.

Although the present invention and its advantages have been described in detail, it should be understood that various changes, substitutions and alterations can be made herein without departing from the spirit and scope of the invention as defined by the appended claims.

What is claimed is:

1. A low power output buffer circuit for outputting a Emitter Coupled Logic(ECL) signal or Pseudo ECL(PECL) signal using a CMOS device comprises:

a power source for supplying a predetermined voltage;

a first input stage for inputting a first ECL signal;

a second input stage for inputting a second ECL signal which is a complementary signal of the first ECL signal;

a first PMOS transistor having a source electrode, a drain electrode and gate electrode, with the source electrode thereof being connected to the voltage source and the gate electrode thereof being connected to the second input stage;

a second PMOS transistor having a source electrode, a drain electrode and gate electrode, with the source electrode thereof being connected to the voltage source and the gate electrode thereof being connected to the first input stage;

a constant current source connected to a ground;

a first NMOS transistor having a source electrode, a drain electrode and gate electrode, with the source electrode thereof being connected to the constant current source, the gate electrode thereof being connected to the second input stage and the drain electrode thereof being connected to the drain electrode of the first PMOS transistor;

a second NMOS transistor having a source electrode, a drain electrode and gate electrode, with the source electrode thereof being connected to the constant current source, the gate electrode thereof being connected to the first input stage and the drain electrode thereof being connected to the drain electrode of the second PMOS transistor;

a first output pad having two terminals, with one terminal thereof being connected to the drain of the second PMOS transistor;

a second output pad having two terminals, with one terminal thereof being connected to the drain of the first NMOS transistor;

a first load resistor having two terminals, with one terminal thereof being connected to the other terminal of the first output pad; and a second load resistor having two terminals, with one terminal thereof being connected to the other terminal of the second output pad and the other terminal thereof being connected to the other terminal of the first load resistor.

* * * * *